United States Patent

Cunningham et al.

[15] 3,667,005

[45] May 30, 1972

[54] OHMIC CONTACTS FOR SEMICONDUCTORS DEVICES

[72] Inventors: James A. Cunningham, Richardson; Coy D. Orr, Dallas, both of Tex.

[73] Assignee: Texas Instruments Incorporated, Dallas, Tex.

[22] Filed: Aug. 3, 1970

[21] Appl. No.: 67,654

Related U.S. Application Data

[62] Division of Ser. No. 561,845, June 30, 1966, Pat. No. 3,616,401.

[52] U.S. Cl. .....................317/234 R, 317/234 L, 317/234 M

[51] Int. Cl. .....................H01l 1/14

[58] Field of Search .....................317/234 L, 234 M, 234 N

[56] References Cited

UNITED STATES PATENTS 3,290,570 12/1966 Cunningham..........................317/240

3,432,913 3/1969 Bronnes et al.........................29/472.7

3,426,252 2/1969 Lepselter..............................317/234

3,287,612 11/1966 Lepselter..............................317/235

*Primary Examiner*—John W. Huckert

*Assistant Examiner*—Martin H. Edlow

*Attorney*—Samuel M. Mims, Jr., Kenneth R. Glaser, James O. Dixon, Andrew M. Hassell and John G. Graham

[57] ABSTRACT

Disclosed are methods for depositing multilayer ohmic contacts upon a substrate of semiconductor material disposed within a low pressure chamber; such including for example the particular features of upward sputtering of the various metal films, simultaneous sputtering of platinum with gold utilizing a sputtering cathode composed of platinum and gold, and adding hydrogen into an inert sputtering atmosphere to eliminate undesirable formation of oxides. This invention provides imporved adhesion of the sputtered metal films to the semiconductor surface and the silicon oxide, and provides the formation of the metal film which is substantially free of pin holes and which has substantially uniform resistivity.

7 Claims, 6 Drawing Figures

OHMIC CONTACTS FOR SEMICONDUCTORS DEVICES

This application is a division of application Ser. No. 561,845, filed June 30, 1966, now U. S. Pat. No. 3,616,401 issued Oct. 26, 1971.

This invention relates to ohmic contacts for transistors, integrated circuits, or the like, and more particularly to the triode sputtering of multilayer ohmic contacts to semiconductor devices.

Ohmic contacts to semiconductor devices must be composed of materials which have good chemical, electrical, thermal, and mechanical properties when applied to semiconductor surfaces. While problems in making contacts exist for all semiconductors, the selection of a contact material or materials is particularly important when the semiconductor is silicon, as in planar transistors and integrated circuits where silicon is at present most commonly used.

As a consequence, therefore, it is desirable to utilize a contact material or materials to silicon semiconductor devices, particularly planar silicon semiconductor devices of the type having an oxide or insulating coating overlying the silicon surface except in the actual contact areas, which adhere well both to the silicon material and the overlying oxide, which do not undesirably penetrate the semiconductor material so as to degrade the device itself, which provide ohmic and low resistance contact to the silicon regions, and which lend themselves to manufacturing techniques compatible with other processes used on the devices.

In accordance with these objects, a particularly advantageous multilayer ohmic contact system has been developed which includes a first thin film comprised of molybdenum and an overlying second thin film comprised of gold, this particular contact system being described and claimed in copending U. S. Pat. application Ser. No. 363,197, filed Apr. 28, 1964, now U.S. Pat. No. 3,290,570, issued Dec. 6, 1966, and assigned to the assignee of the present application. While this particular contact system has been observed to have substantial advantages over others, the present-day method for applying these various thin films to the surface of the semiconductor wafer, namely by evaporation, has presented some problems which have prevented the utilization of this contact system to its full potential. For example, the method for defining the lead and interconnection pattern involves the initial deposition of the metal layers over the entire oxidized semiconductor slice, followed by a series of photographic masking and etching techniques which selectively remove the metal layers except in the desired pattern of the leads and interconnections. To avoid the peeling or undercutting of the metallic films during these etching operations, it is preferred that the molybdenum film adhere tightly to the oxide coating, and that the overlying gold layer adhere tightly to the molybdenum film. In addition, it is desirable to physically isolate the overlying gold from the bare silicon material so as to avoid undesirable alloying therewith, and the consequent degradation of the junction regions. This latter requirement necessitates that the molybdenum layer be continuous and substantially free of pinholes and imperfections. While these results have been achieved to some extent with the use of conventional evaporation techniques, for example, of the molybdenum and gold layers, it has been found that on a very high production basis, existing techniques for depositing these thin films or layers result in devices having very low yields.

It is therefore one object of the present invention to provide a new and improved method for the deposition of a multilayer ohmic contact and interconnection system for semiconductor devices, particularly a system which includes a pair of thin films substantially comprised of molybdenum and gold, respectively. It is an even more specific object to provide a deposition technique which not only produces a continuous molybdenum film substantially free of pinholes, but one which results in the molybdenum layer tightly adhering to the overlying protective oxide coating, and an overlying gold or gold-alloy film tightly adhering to the molybdenum film. It is another object of the invention to provide a novel multilayer contact and interconnection system which adheres well to silicon and to silicon oxide surfaces without reacting unfavorably with either, which can be used with available photoresist masking and etching procedures, and which forms an ohmic and low resistance electrical contact to the silicon material.

Accordingly, the present invention involves a deposition technique, referred to as triode sputtering, to deposit the various thin metallic films. Particular features of the present invention include the upward sputtering of the various metal films, the simultaneous sputtering of platinum with gold by using a sputtering cathode composed of platinum and gold rather than pure gold and the addition of hydrogen into an inert (argon) sputtering atmosphere to eliminate the undesirable formation of oxides. Among the advantages realized by these techniques have been a significant improvement in the adhesion of the sputtered molybdenum to the semiconductor surface and the silicon oxide, a continuous molybdenum film which, for all practical purposes is free of any pinholes, and metallic films of substantially uniform resistivity.

The novel features believed characteristic of this invention are set forth in the appended claims. The invention itself, however, as well as other objects and advantages thereof, may best be understood by reference to the following detailed description of illustrative embodiments, read in conjunction with the accompanying drawings, wherein:

Figure 1:
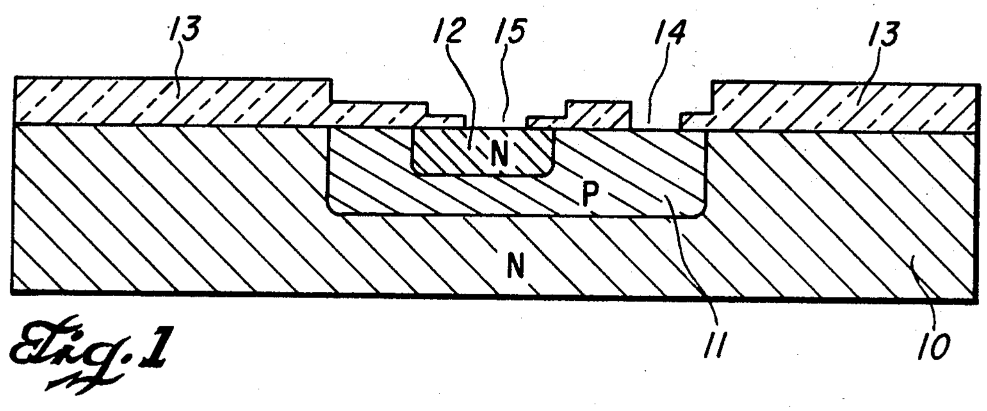
FIGS. 1–4 are sectional views of the various steps in the fabrication of an N-P-N transistor utilizing the deposition technique of the present invention for the application of the ohmic contacts and interconnections.

With reference to FIG. 1, there is shown a semiconductor wafer 10 having a transistor formed therein including base and emitter regions 11 and 12, respectively, the remainder of the wafer 10 providing the collector region. The transistor is formed by conventional planar techniques, using successive diffusions with silicon oxide masking. This process leaves an oxide coating 13 on the top surface of the wafer, this coating having a stepped configuration due to the successive diffusion operations. For high frequencies, the geometry of the active part of the transistor is ordinarily extremely small, the elongated emitter region 12 being perhaps 0.1 to 0.2 mil (0.0002 inch) wide and less than a mil long. Holes 14 and 15 are then provided within the oxide layer 13 for the base and emitter contacts respectively. Typically, the wafer 10 is merely a small undivided part of a larger slice of silicon, perhaps 1 inch in diameter and 8 mils thick, the slice being scribed and broken into individual wafers or dice after the contacts are applied. After various cleaning operations to prepare the surface of the oxide and the semiconductor material for the contacts, the transistor device of FIG. 1 is now ready to have the multilayered contact system deposited in accordance with the process of this invention.

Figure 2:
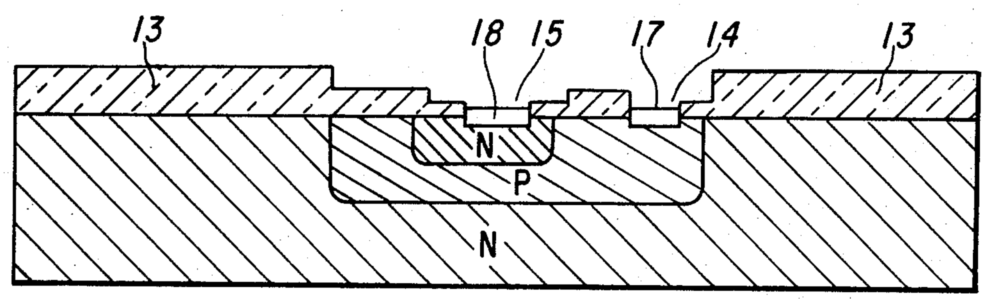

Before such depositing, however, it has been observed that the formation of a sintered platinum-silicide deposit in the contact areas prior to the deposition of the thin molybdenum film improves the mechanical and ohmic contact of molybdenum to the semiconductor surface. Consequently, after the final oxide removal exposing the base and emitter contact areas, 1 or 2 microinches of platinum are evaporated onto the entire slice located in a high vacuum and at a substrate temperature of approximately 250° C. The coated slice is then placed within a quartz tube furnace in a nitrogen atmosphere and heated for 20 minutes at approximately 700° C, this heating causing a sintering at the platinum-silicon interface. The slice is then boiled in aqua regia to remove the platinum from the oxide area but leaving sintered platinum-silicide deposits 17 and 18 in the base and emitter contact areas respectively, as shown in FIG. 2.

Figure 6:
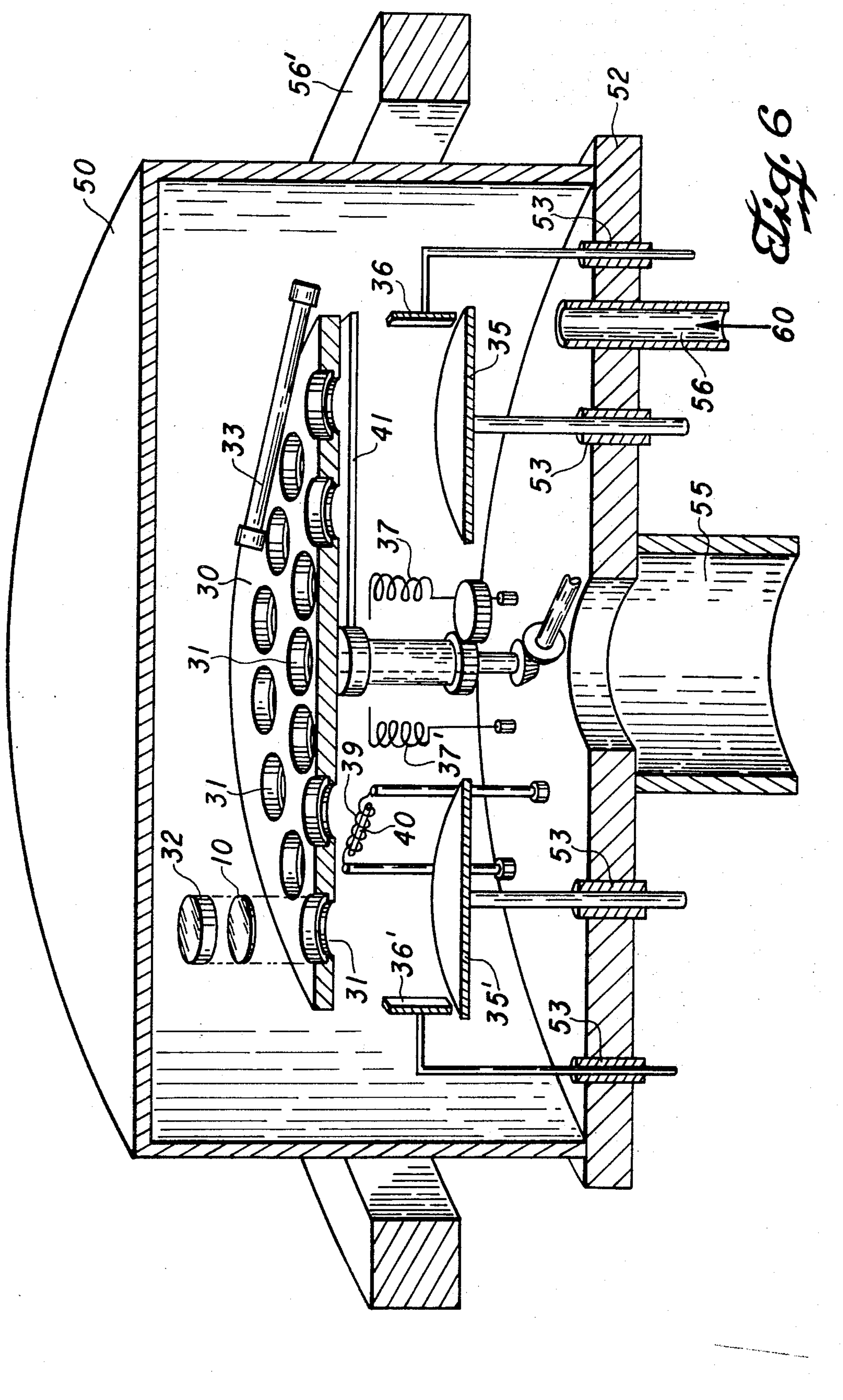
FIG. 6 is a representation of one form of apparatus used in practicing the invention.

Referring to FIG. 6, there is depicted one form of triode sputtering apparatus utilized for depositing the metallic ohmic multilayer contact in accordance with the invention. The apparatus comprises a stainless steel turntable 30 having precision-milled slots or grooves 31 in which the silicon slices 10 with the platinum-silicide contacts 17 and 18 thereupon are placed. Above the turntable 30 is a bank of quartz infrared heaters as the lamp 33 tilted at a specific angle (approximately 20°), these functioning to heat the slices 10 to any desired temperature and to hold the slice temperature at the selected point with a fair degree of precision. A suitable temperature control, including a thermal couple and a feedback arrangement (not shown) is provided for this latter purpose. A loose fitting stainless steel disk 32 is placed onto the backside of each slice to provide uniform heat transfer.

The "heart" of the triode sputtering apparatus are the cathodes 35 and 35' (formed of the metal to be deposited), anodes 36 and 36' (usually formed of molybdenum), and cathodic filaments 37 and 37' (usually of tungsten). In addition, there is positioned a tungsten coil 39 for evaporating a charge 40 of gold. A shutter 41 which may be pivoted over either the cathodes 35 and 35' or over the evaporation coil 39 is mounted beneath the turntable 30 as shown. The turntable 30 may be rotated at a suitable rate by a combination of motor and gear drive connected thereto. All of the components described are mounted within a bell jar or chamber 50 mounted on a base plate 52, all of the electrodes being electrically isolated from the base plate 52 by feedthrough collars 53 fabricated of glazed ceramic for example. An opening 55 in the base plate 52 is connected to a vacuum pump for evacuating the chamber. Another opening 56 is provided for the introduction of the sputtering atmospheric gas mixture 60 in accordance with the invention.

Since the sputtering rate and texture of the deposited films are somewhat influenced by the pressure of the sputtering chamber, an electronic servo-driven flow controller is strongly recommended to hold the chamber pressure to the correct range. The voltages for the cathodic filaments, cathodes and anodes can be quickly switched from one set of electrodes to the other by means of a ganged switch (not shown) for sputtering the various layers of the invention. A circular magnet 56' surrounding the bell jar 50 may be utilized if desired to create an internal magnetic field which is used to concentrate the glow discharge formed.

The silicon slices 10 with the platinum-silicide contacts 17 and 18 (as shown in FIG. 2) are loaded face down in the grooves of the stainless steel turntable 30, covered with the disks 32, and the turntable is then rotated at a constant speed of approximately 30 rpm or greater. The bell jar 50 is evacuated to a pressure below $5 \times 10^{-6}$ Torr and the infrared lamps 33 are energized to heat the slices to approximately 200° C. A gas mixture 60 composed substantially of an inert gas such as argon, krypton, or xenon flows into the evacuated chamber through the opening 56 to establish a chamber pressure of approximately $2 \times 10^{-3}$ Torr. It is presently desirable to utilize argon as the inert gas since it is presently available in high purity at a reasonable cost. Krypton and xenon, being of higher mass, are of particular interest if economically available. As will subsequently be described, the gas flow 60 does not have to be composed entirely of argon but as a particular feature of the process may actually be a mixture of argon and hydrogen ($H_2$) gas, the hydrogen gas providing a reducing atmosphere which substantially eliminates the formation of undesirable oxides on the various surfaces.

Figure 3:
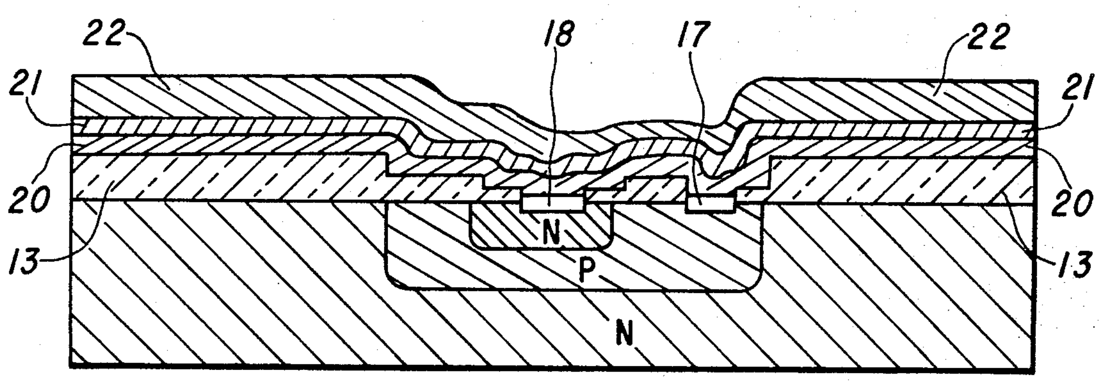

The tungsten filament 37 is then heated to incadescence to emit electrons. These electrons are then attracted with considerable velocity to the positively charged anode 36. During their trip, they collide with argon molecules in the chamber, thereby producing a glow discharge of positively charged argon ions above the cathode plate 35. A very strong negative voltage is then applied to the cathode plate 35 which consequently attracts these positively charged argon ions. The ions strike the surface of the metal cathode 35 with tremendous kinetic energy, this energy being transferred to the cathode, "sputtering" metal atoms of the cathode plate from its surface to the silicon slices 10. Therefore, when the cathode plate 35 is of molybdenum, a thin film 20 of molybdenum, shown in FIG. 3, is deposited by sputtering over the entire surface of the oxide mask 13 and within the apertures 14 and 15 upon the platinum-silicide contact surfaces 17 and 18, respectively.

In similar manner, the cathode plate 35', which may be formed of gold, and when the cathodic filament 37', anode 36', and cathode 35' are energized as above, a thin film 21 of gold may be triode sputtered upon the molybdenum layer 20.

In accordance with a specific feature of the invention, however, the cathode 35' is not entirely of gold but is either of a platinum-gold alloy or is a gold cathode which has a portion of its surface area covered with platinum. This allows a simultaneous sputtering of platinum and gold to provide a layer 21 of platinum-gold rather than one of pure gold. It was observed that when small amounts of platinum were sputtered simultaneously with the gold, there was a substantial improvement in the adhesion of the resulting layer 21 to the molybdenum film. For example, tests were run to determine the amount of force required to "pull" the layer 21 from the molybdenum film 20 when the cathode 35' had the following percents (by weight) of platinum (and consequently the same percentage composition of the sputtered layer 21) covering its surface:

| % of Pt on Surface of Cathode | Force Required |
|---|---|
| 0 | 5 grams |
| 0.1 | 8 grams |
| 2.0 | 20 grams |
| 5.0 | 24 grams |
| 10.0 | 24 grams |

It was concluded therefore that by using a composition of 95 percent gold–5 percent platinum for the layer 21 instead of pure gold, there is almost a 400 percent increase in adhesion to the molybdenum film 20. In addition, the resulting layer 21 was found to be smooth and continuous, preventing the oxidation of the underlying molybdenum film during any subsequent high temperature operations. Furthermore, the sheet resistivity of the platinum-gold layer 21 was found to be substantially uniform over its entire surface area.

Thereafter as the next step, a gold layer 22 is deposited by evaporation upon the platinum-gold film 20 by energizing the coils 39 to evaporate the charge 40 of gold. Gold wires may then be bonded to the layer 22 for external connections. In summary therefore, the optimum process steps of the present invention include the triode sputtering of the molybdenum film, the triode sputtering of a platinum-gold film, and the evaporation of an overlying gold layer. If desired, a shutter 41 shown in FIG. 6 may be pivoted over the cathodes or over the evaporation coil for a short time prior to the actual deposition of each layer to prevent the deposition of any foreign particles that may be upon either of the cathode or coil surfaces.

It has been observed that there appears to be a tendency for an oxide film to form upon the platinum-silicide surfaces, and upon the thin film of molybdenum, due to the presence of oxygen within the sputtering chamber. These oxides "skins" undesirably increase the total resistance of the resulting multilayer contact, as well as detrimentally decreasing the adherence of each of the thin films to the other. In addition, the presence of the oxygen within the chamber often causes an oxide to form on the molybdenum anodes. As a consequence, and as another specific feature of the present invention, hydrogen gas is incorporated with the argon gas of the flow 60 to provide a reducing atmosphere within the chamber 50 which thereby prevents the oxidation of the various metallic surfaces. For example, samples were sputtered in hydrogen-argon atmospheres ranging from pure argon to a 10 percent hydrogen–90 percent argon mixture, the latter mixture providing particularly good results.

As another particular feature of the invention, it was determined that by placing the silicon slices above the electrodes, as depicted, and sputtering upward, it was possible to substantially reduce or eliminate any particles or "flakes" of metal. In the particular case of molybdenum, a molybdenum film was produced having a substantially uniform grain structure.

The triode deposition of the various metal films is dependent upon the various process parameters. For example, in one particular example, when the cathodes 35 and 35' were shaped in the form of a segment of a circle of six-square-inch surface area, the following conditions were maintained:

Cathodic filament voltage: 12 volts AC
Cathodic filament current: 40 amps
Anode voltage: +50 volts DC
Anode current: 5 amps
Cathode voltage: −1.200 volts DC
Cathode current: 100 milliamps
Chamber pressure: $2 \times 10^{-3}$ Torr
Substrate temperature: 200° C
Rate of rotation of turntable: 30 rpm When the above conditions were maintained, the molybdenum film was sputtered at a rate of approximately 0.20 microinches per minute, and the 5 percent platinum–95 percent gold layer at a rate of approximately 0.11 microinches per minute. Investigation of various combinations resulted in the determination that the optimum advantages may be achieved with a first thin film of 10 microinches sputtered molybdenum, a second thin film of 2 microinches sputtered platinum-gold, and 26 microinches of evaporated gold. In this manner, the technical advantages of the triode sputtered films are achieved while taking advantage of the ordinarily shorter deposition time of the final overlying evaporated gold layer.

Figure 4:
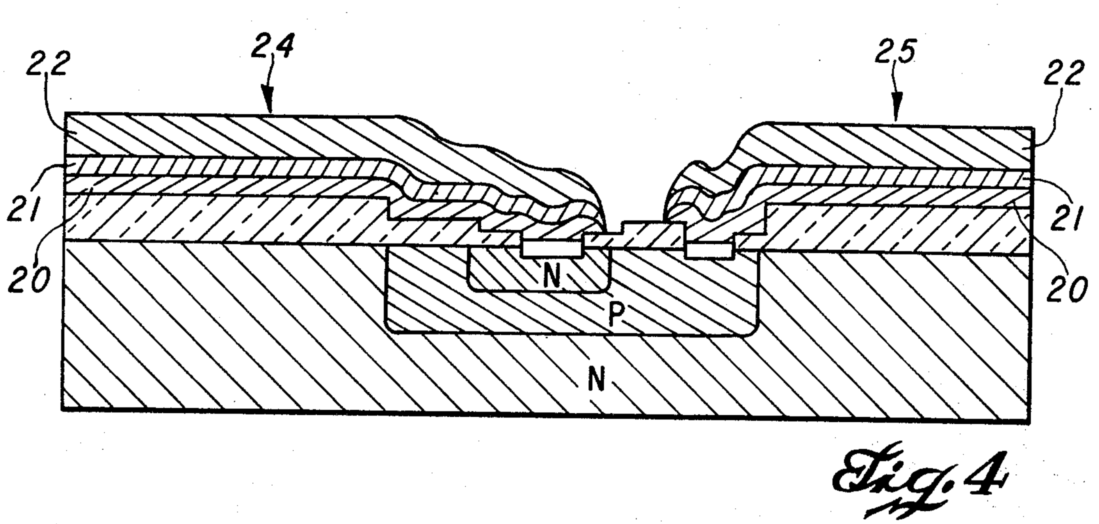

With the deposition of the films 20, 21 and 22 completed, the slices are removed from the chamber 50 for the selective removal of the metallic coatings by conventional photographic and etching techniques to define the individual expanded contacts. Thus the emitter contact 24 and the base contact 25 are formed as illustrated in FIG. 4. A suitable etching solution for selectively removing the gold layer 22 and the platinum-gold layer 21 is an alkaline cyanide, while nitric acid may be utilized in the etching of the molybdenum layer 20 where it is undesired. Contact to the collector may then be effected, for example, by mounting on a conductive base.

Figure 5:
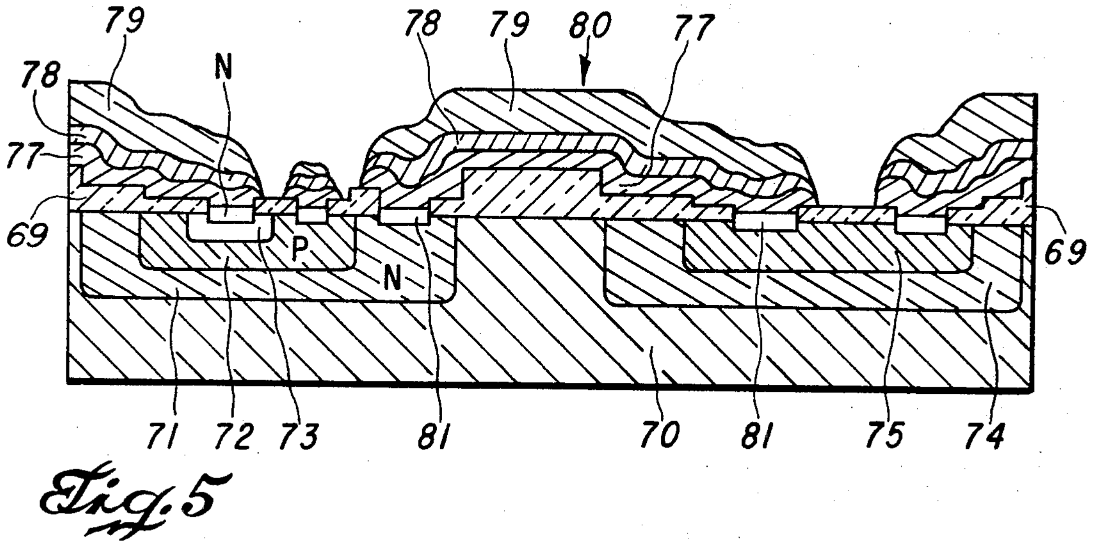
FIG. 5 is a cross sectional view of a portion of a semiconductor wafer in which an integrated circuit is formed utilizing the deposition techniques and contact system of the present invention.

Referring now to FIG. 5, a portion of an integrated circuit structure is shown in section which comprises a P-type silicon wafer 70 having a transistor formed on the left hand end by a diffused N-type collector 71, a P-type base region 72 and N-type emitter region 73. On the right hand side is a resistor being provided by a P-type diffused region 75 ordinarily formed simultaneously with the base region of the transistor, the resistor being isolated from the transistor by the isolation region 74. Thereafter holes are cut in the oxide coating 69 upon the surface of the wafer where the transistor contacts and the resistors contacts are to be made, and the previously described process is used to apply a triode sputtered molybdenum coating 77, a triode sputtered platinum-gold film 78, and an overlying gold layer 79, these metal coatings being selectively removed to produce the desired pattern of contacts and interconnections. Thus, for example, the collector 71 is connected to one end of the resistor by an interconnection 80 which extends over the oxide. A typical integrated circuit would include in the same semiconductor wafer many transistors and resistors of the type seen in FIG. 5, rather than one of each. Of course, the platinum-silicide deposits 81 may be made in the various contact areas as before.

Utilizing the above described process significant improvements have been achieved. Due to the increased adherence of the molybdenum film to the oxide coating and the platinum-gold film to the molybdenum film (thus avoiding undercutting during the various etching operations), and due to the continuous pinhole free nature of the molybdenum layer (thus preventing the undesirable contact between the gold and silicon materials), substantial improvement in yields were observed during high rates of production. For example, one line of integrated circuits using the contact system and deposition technique of the present invention has resulted in a percentage improvement in yield in excess of 40 percent. Furthermore, triode sputtering is analogous to an elemental triode vacuum tube, and offers a means for closely controlling the process by regulating the voltages and currents of the filament, anode, and cathode electrodes.

While the above described process has suggested the initial formation of sintered platinum-silicide deposits in the contact areas prior to the sputtering of the molybdenum film, in some situations it may be desirable to avoid this step. For example, the selective diffusion of gold into the semiconductor wafer prior to fabrication is often utilized to lower the carrier lifetime therein. During the sintering of the platinum, the heat produced often causes precipitation and redistribution of the gold impurities with corresponding detrimental effects on the device characteristics. Therefore, it may be desirable to triode sputter the molybdenum film directly upon the silicon surface or, alternatively, form a very thin layer (approximately 200 A) of evaporated aluminum onto heated (600° C) silicon in place of the sintered platinum material.

Various other modifications of the disclosed processes, may become apparent to persons skilled in the art without departing from the spirit and scope of the invention as defined by the appended claims.

What is claimed is:

1. A contact and lead arrangement for a semiconductor device of the type including a silicon wafer having a region adjacent one face thereof with a P-N junction between such region and other silicon of the wafer extending to said one face beneath a silicon oxide coating, the coating defining a small opening over said region, the contact and lead arrangement comprising a first triode sputtered film of molybdenum in ohmic contact with said region in said opening in the silicon oxide coating, the triode sputtered film of molybdenum extending from said opening out over said silicon oxide coating in direct contact therewith and over the edge of said junction to a position spaced from said region on said one face, and a second triode sputtered film of platinum and gold overlying said film of molybdenum wherein said second triode sputtered film is comprised of gold in the range of 90–98 percent and platinum in the range of 10–2 percent by weight.

2. The arrangement as described in claim 1 including a sintered platinum silicide contact intermediate said region and said first triode sputtered film.

3. The arrangement as described in claim 1 including a layer of evaporated gold overlying said second triode sputtered film of platinum and gold.

4. A contact and lead arrangement for a semiconductor device of the type including a silicon wafer having a region adjacent one face thereof with a P-N junction between such region and other silicon of the wafer extending to said one face beneath a silicon oxide coating, the coating defining a small opening over said region, the contact and lead arrangement comprising a first film of molybdenum in ohmic contact with said region in said opening in the silicon oxide coating, the film of molybdenum extending from said opening out over said silicon oxide coating in direct contact therewith and over the edge of said junction to a position spaced from said region on said one face, and a second film of platinum and gold overlying said film of molybdenum wherein said second film is comprised of gold in the range of 90–98 percent and platinum in the range of 10–2 percent by weight.

5. The arrangement as described in claim 4 including a sintered platinum silicide contact intermediate said region and said first film.

6. The arrangement as described in claim 4 including a layer of evaporated gold overlying said second film of platinum and gold.

7. A contact and lead arrangement for a semiconductor device comprising in combination:

a. a substrate of semiconductor material of one conductivity type;

b. a plurality of opposite conductivity type regions at one major face of said substrate;

c. a layer of insulating material overlying and adherent to said one major face with a plurality of apertures formed therein and exposing selected portions of said regions;

d. a layer of platinum silicide in ohmic contact with each of said exposed portions of said regions;

e. a first triode-sputtered layer of molybdenum overlying and adhered to said portions of insulating layer and in ohmic contact with said platinum silicide layer; said first triode-sputtered layer selectively connecting said regions;

f. a second triode-sputtered layer of platinum and gold alloy overlying and in ohmic contact with said first triode-sputtered layer, said second triode-sputtered layer being comprised of 5 percent platinum and 95 percent gold by weight; and g. an evaporated layer of gold overlying and in ohmic contact with said second triode-sputtered layer.

* * * * *